(12) United States Patent
Navarro et al.

(10) Patent No.: US 10,199,135 B2
(45) Date of Patent: Feb. 5, 2019

(54) STABLE COMPOSITIONS OF CARBON NANOTUBES-ELECTROLYTIC POLYMERS

(71) Applicants: Arkema France, Colombes (FR); Centre National De La Recherche Scientifique (CNRS), Paris (FR); Universite De Bordeaux, Bordeaux (FR); Institut Polytechnique De Bordeaux, Talence (FR)

(72) Inventors: Christophe Navarro, Bayonne (FR); Wiljan Smaal, Talence (FR); Muhammad Mumtaz, Bordeaux (FR); Eric Cloutet, Saint Caprais de Bordeaux (FR); Cyril Brochon, Merignac (FR); Georges Hadziioannou, Leognan (FR)

(73) Assignees: ARKEMA FRANCE, Colombes (FR); CENTRE NATIONAL DE LA RECHERCHE SCIENTIFIQUE, Paris (FR); UNIVERSITE DE BORDEAUX, Bordeaux (FR); INSTITUT POLYTECHNIQUE DE BORDEAUX, Talence (FR)

( * ) Notice: Subject to any disclaimer, the term of this patent is extended or adjusted under 35 U.S.C. 154(b) by 0 days.

(21) Appl. No.: 15/033,455

(22) PCT Filed: Oct. 29, 2014

(86) PCT No.: PCT/FR2014/052751
§ 371 (c)(1),
(2) Date: Apr. 29, 2016

(87) PCT Pub. No.: WO2015/063417
PCT Pub. Date: May 7, 2015

(65) Prior Publication Data
US 2016/0276057 A1    Sep. 22, 2016

(30) Foreign Application Priority Data
Oct. 31, 2013 (FR) .................................. 13 60685

(51) Int. Cl.
| H01B 1/04 | (2006.01) |
| C08K 3/00 | (2018.01) |
| H01B 1/24 | (2006.01) |
| C08K 3/04 | (2006.01) |
| H01L 51/00 | (2006.01) |
| H01L 51/44 | (2006.01) |
| H01L 51/52 | (2006.01) |

(52) U.S. Cl.
CPC .................. H01B 1/24 (2013.01); C08K 3/04 (2013.01); C08K 3/041 (2017.05); H01L 51/004 (2013.01); H01L 51/0048 (2013.01); H01L 51/444 (2013.01); H01L 51/5206 (2013.01); H01L 51/5234 (2013.01); C08F 2438/03 (2013.01)

(58) Field of Classification Search
CPC ........... H01B 1/04; H01B 1/24; H01L 51/004; H01L 51/0048; H01L 51/5234; C08F 2438/03; C08K 3/00
USPC ....................................................... 252/502
See application file for complete search history.

(56) References Cited

U.S. PATENT DOCUMENTS

| 2010/0308281 | A1* | 12/2010 | Zheng ................. C08L 101/005 252/519.33 |
| 2012/0295166 | A1* | 11/2012 | Gennett ................. B82Y 30/00 429/314 |
| 2014/0230900 | A1* | 8/2014 | Cull ..................... H01L 51/0007 136/263 |
| 2014/0272600 | A1* | 9/2014 | Bouchet ................. C08J 5/2243 429/305 |
| 2015/0060737 | A1 | 3/2015 | Navarro |

FOREIGN PATENT DOCUMENTS

| WO | WO-2013034848 A1 * | 3/2013 | ............ C08J 5/2243 |
| WO | 2013150242 | 10/2013 | |

OTHER PUBLICATIONS

International Search Report and Written Opinion for International Application PCT/FR2014/052751, dated Apr. 28, 2015, 5 pages.
Murata et al., "An overview of the research and development of solid polymer electrolyte batteries", Electrochimica Acta, vol. 45, Jan. 2000, Abstract Only 2 pages.
Golas et al., "Comparative Study of Polymeric Stabilizers for Magnetite Nanoparticles Using ATRP", Langmuir, vol. 26, 2010, Abstract Only, 2 pages.
Louwet et al.,"PEDOT/PSS: synthesis, characterization, properties and applications", Synthetic Metals, vol. 135-136, 2003, Abstract Only, 1 page.
Malti, A., et al., "Low-voltage ambipolar polyelectrolyte-gated organic thin film transistors," Apr. 30, 2012, pp. 183302.1-183302.3, vol. 100, Applied Physics Letters.

* cited by examiner

*Primary Examiner* — Tri V Nguyen
(74) *Attorney, Agent, or Firm* — RatnerPrestia

(57) ABSTRACT

The invention relates to stable compositions of carbon nanotubes and of electrolytic polymers, these electrolytic polymers being characterized by the presence of phosphonyl imide or sulfonyl imide functions or alternatively phosphoric acid functions. The invention also relates to the manufacture of transparent electrodes comprising these compositions of carbon nanotubes and of electrolytic polymers.

20 Claims, No Drawings

STABLE COMPOSITIONS OF CARBON NANOTUBES-ELECTROLYTIC POLYMERS

CROSS-REFERENCE TO RELATED APPLICATIONS

This is the national phase of International Application No. PCT/FR2014/052751, filed 29 Oct. 2014, which claims priority from French Application No. 13.60685, filed 31 Oct. 2013. The disclosure of each of these applications is incorporated herein by reference in its entirety for all purposes.

FIELD OF THE INVENTION

The invention relates to stable compositions of carbon nanotubes and of electrolytic polymers, these electrolytic polymers being characterized by the presence of phosphonyl imide or sulfonyl imide functions or alternatively phosphoric acid functions. The invention also relates to the manufacture of transparent electrodes comprising these compositions of carbon nanotubes and of electrolytic polymers.

DISCUSSION OF THE RELATED ART

Carbon nanotubes (CNT) are materials that are very promising in fields as diverse as high-performance materials and electronics. They exist in the form of single-walled and multi-walled nanotubes. Unfortunately, they are difficult to use alone since they are in the form of aggregates, which especially do not allow light transmission when, for example, they are deposited onto a support. However, given the size of nanotube fibrils and their intrinsic conductivity, they are good candidates for manufacturing transparent electrodes.

Electrolytic polymers have been widely used in applications as varied as lithium batteries as ionic conductors (K. Murata, S. Izuchi, Y. Yoshihisa, *Electrochimica Acta* 2000, 45, 1501), for manufacturing organic transistors (A. Malti, M. Berggren, X. Crispin, *Appl. Phys. Lett.* 2012, 100, 183-302.), stabilizing magnetite particles (P. L. Golas, S. Louie, G. V. Lowry, K. Matyjaszewski, R. D. Tilton, *Langmuir* 2010, 26, 16890-16900), or as dopants and stabilizers for the synthesis of conductive polymers (F. Louwet, L. Groenendaal, J. Dhaen, J. Manca, J. V. Luppen, E. Verdonck, L. Leenders, *Synth. Met.* 2003, 135-136, 115.).

The Applicant has now discovered that certain combinations of ionic monomers comprising phosphonyl imide or sulfonyl imide functions or alternatively phosphoric acid functions, in the form of homopolymers or block or nonblock copolymers, allow good dispersion of CNTs in aqueous solutions and that the films obtained using these dispersions, once the water has evaporated, afford a very good transmission-conductivity compromise.

SUMMARY OF THE INVENTION

The invention relates to a composition comprising carbon nanotubes and an electrolytic (co)polymer, this electrolytic (co)polymer comprising monomers corresponding to formula I.

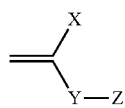

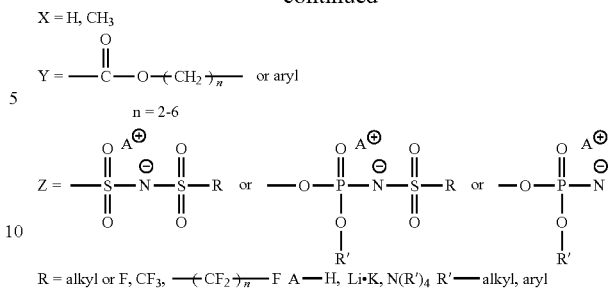

$X = H, CH_3$ $R = $ alkyl or $F$, $CF_3$, $-(CF_2)_n- F$  $A = H$, Li·K, $N(R')_4$  $R' = $ alkyl, aryl

DETAILED DESCRIPTION

The carbon nanotubes used in the invention may be single-walled, double-walled or multi-walled.

The electrolytic (co)polymers used in the invention comprise species corresponding to formula (I). They are homopolymers of a species corresponding to formula (I), copolymers comprising at least one species corresponding to formula (I) or alternatively block copolymers in which at least one of the blocks comprises one or more species corresponding to formula (I).

When the electrolytic polymers are copolymers comprising at least one species corresponding to formula (I), the proportion of the species corresponding to formula I represents more than 50% by mass relative to the weight of the copolymer, preferably more than 80% by weight and more preferably more than 90% by weight. The remaining monomer species consist of monomers of any possible type that can undergo radical polymerization.

When the electrolytic polymers are block copolymers, they may be diblock, triblock or multiblock copolymers, provided that at least one of the blocks comprises one or more species corresponding to formula (I), the other blocks comprising monomers that may be chosen from (meth) acrylates, typically acrylic or methacrylic acid, acrylamide, methacrylamide, styrene, N-vinylpyrrolidone, 4-vinylpyridine and more specifically methyl methacrylate, methacrylic acid and styrene.

Any chemistry allowing radical polymerization may be used, whether it is controlled or otherwise. Preferably, nitroxide-controlled radical polymerization or RAFT (radical addition fragmentation transfer), and more preferably RAFT, is used.

Thus, according to a first aspect of the invention, controlled radical polymerization is performed starting with alkoxyamines derived from the stable free radical (1).

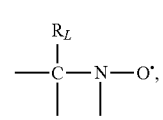

(1)

in which the radical $R_L$ has a molar mass of greater than 15.0342 g/mol. The radical $R_L$ may be a halogen atom such as chlorine, bromine or iodine, a linear, branched or cyclic, saturated or unsaturated hydrocarbon-based group such as an alkyl or phenyl radical, or an ester group —COOR or an alkoxy group —OR, or a phosphonate group —PO(OR)$_2$, provided that it has a molar mass of greater than 15.0342. The monovalent radical $R_L$ is said to be in the β position relative to the nitrogen atom of the nitroxide radical. The remaining valency positions of the carbon atom and of the nitrogen atom in formula (1) may be bonded to various radicals such as a hydrogen atom, a hydrocarbon-based radical such as an alkyl, aryl or arylalkyl radical, comprising from 1 to 10 carbon atoms. It is not excluded for the carbon atom and the nitrogen atom in formula (1) to be linked together via a divalent radical, so as to form a ring. Preferably, however, the remaining valency positions of the carbon atom and of the nitrogen atom of formula (1) are linked to monovalent radicals. Preferably, the radical $R_L$ has a molar mass of greater than 30 g/mol. The radical $R_L$ may have, for example, a molar mass of between 40 and 450 g/mol. By way of example, the radical $R_L$ may be a radical comprising a phosphoryl group, said radical $R_L$ possibly being represented by the formula:

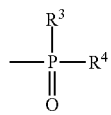

(2)

in which $R^3$ and $R^4$, which may be identical or different, may be chosen from alkyl, cycloalkyl, alkoxy, aryloxy, aryl, aralkyloxy, perfluoroalkyl and aralkyl radicals, and may comprise from 1 to 20 carbon atoms. $R^3$ and/or $R^4$ may also be a halogen atom such as a chlorine or bromine or fluorine or iodine atom. The radical $R_L$ may also comprise at least one aromatic ring as for the phenyl radical or the naphthyl radical, the latter possibly being substituted, for example with an alkyl radical comprising from 1 to 4 carbon atoms.

More particularly, the alkoxyamines derived from the following stable radicals are preferred:
N-tert-butyl-1-phenyl-2-methylpropyl nitroxide,
N-tert-butyl-1-(2-naphthyl)-2-methylpropyl nitroxide,
N-tert-butyl-1-diethylphosphono-2,2-dimethylpropyl nitroxide,
N-tert-butyl-1-dibenzylphosphono-2,2-dimethylpropyl nitroxide,
N-phenyl-1-diethylphosphono-2,2-dimethylpropyl nitroxide,
N-phenyl-1-diethylphosphono-1-methylethyl nitroxide,
N-(1-phenyl-2-methylpropyl)-1-diethylphosphono-1-methylethyl nitroxide,
4-oxo-2,2,6,6-tetramethyl-1-piperidinyloxy,
2,4,6-tri-tert-butylphenoxy.

The alkoxyamines used in controlled radical polymerization must allow good control of the sequence of monomers. Thus, they do not all allow good control of certain monomers. For example, the alkoxyamines derived from TEMPO make it possible to control only a limited number of monomers, and this is likewise the case for the alkoxyamines derived from 2,2,5-trimethyl-4-phenyl-3-azahexane 3-nitroxide (TIPNO). On the other hand, other alkoxyamines derived from the nitroxides corresponding to formula (1), particularly those derived from the nitroxides corresponding to formula (2) and even more particularly those derived from N-tert-butyl-1-diethylphosphono-2,2-dimethylpropyl nitroxide, make it possible to broaden to a large number of monomers the controlled radical polymerization of these monomers.

In addition, the opening temperature of the alkoxyamines also has an influence on the economic factor. The use of low temperatures will be preferred to minimize the industrial difficulties. A preference will thus be given to alkoxyamines derived from the nitroxides corresponding to formula (1), particularly those derived from the nitroxides corresponding to formula (2) and even more particularly those derived from N-tert-butyl-1-diethylphosphono-2,2-dimethylpropyl nitroxide to those derived from TEMPO or 2,2,5-trimethyl-4-phenyl-3-azahexane 3-nitroxide (TIPNO).

According to a second aspect of the invention, which is the preferred mode, the controlled radical polymerization takes place via RAFT, and more particularly with an RAFT agent corresponding to formula 2 below:

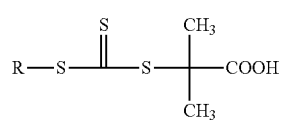

2 in which R represents an alkyl group comprising 1 to 22 carbon atoms and preferably 10 to 18 carbon atoms.

The synthesis of block copolymers may be performed by first preparing the macro-initiator polyelectrolyte block and then, in a second stage, the monomers of the second block may be polymerized, optionally accompanied by other steps for synthesizing other blocks taking into account other monomers. A macro-initiator block may also be prepared via any other chemistry (anionic, cationic, ring-opening, polycondensation) including one or two end groups allowing the subsequent priming of the monomers comprising the species (I).

Numerous combinations may thus be obtained, for instance in the case of diblock copolymers, hydrophilic-hydrophilic, hydrophilic-hydrophobic, anionic-neutral, anionic-anionic, anionic-cationic or cationic-neutral diblocks.

These electrolytic polymers are used in practice for dispersing single-walled or multi-walled carbon nanotubes in electrolytic polymer-CNT mass ratios ranging from 1:10 to 10:1 and preferably from 1:10 to 1:1. The aqueous dispersions of these compositions are stable. They may be placed in the form of thin films via techniques such as spray coating or roll-to-roll for large surfaces. The films derived from these preparations have good electrical conductivity, good optical transmission, good heat stability and also good mechanical properties. They can advantageously replace indium titanium oxide (ITO) as transparent electrode in the fields of optoelectronics and more particularly OLEDs (organic light-emitting diodes) or alternatively photovoltaic organic cells.

These electrolytic polymers may also be used alone, i.e. without CNTs, in the manufacture of membranes that are useful for fuel cells, as ionic conductors or alternatively as stabilizers for particles other than CNTs.

The invention claimed is:

1. A composition comprising carbon nanotubes and an electrolytic non-block (co)polymer, the electrolytic non-block (co)polymer comprising, in polymerized form, one or more monomers corresponding to formula I:

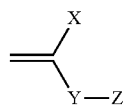

I

-continued

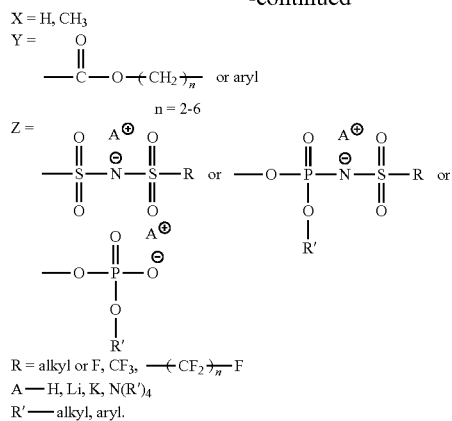

2. A composition according to claim 1, wherein the electrolytic non-block (co)polymer is a homopolymer.

3. A composition according to claim 1, wherein the electrolytic non-block (co)polymer is a statistical copolymer.

4. A composition according to claim 1, wherein the carbon nanotubes are single-walled.

5. A composition according to claim 1, wherein the carbon nanotubes are multi-walled.

6. A composition according to claim 1, wherein the electrolytic non-block (co)polymer is prepared by controlled radical polymerization.

7. A composition according to claim 6, wherein the electrolytic non-block (co)polymer is prepared by a radical polymerization controlled by a nitroxide.

8. A composition according to claim 7, wherein the nitroxide is N-tert-butyl-1-diethylphosphono-2,2-dimethyl-propyl nitroxide.

9. A composition according to claim 6, wherein the electrolytic non-block (co)polymer is prepared by a radical polymerization controlled by a RAFT agent.

10. A composition according to claim 9, wherein the RAFT agent corresponds to formula 2 below:

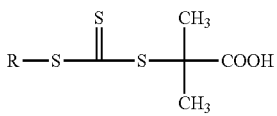

in which R represents an alkyl group comprising 1 to 22 carbon atoms.

11. A composition according to claim 1, wherein the electrolytic non-block (co)polymer comprises more than 50% by mass relative to the weight of the electrolytic non-block (co)polymer of the one or more monomers corresponding to formula I.

12. A composition according to claim 1, wherein the electrolytic non-block (co)polymer comprises more than 80% by mass relative to the weight of the electrolytic non-block (co)polymer of the one or more monomers corresponding to formula I.

13. A composition according to claim 1, wherein the electrolytic non-block (co)polymer comprises more than 90% by mass relative to the weight of the electrolytic non-block (co)polymer of the one or more monomers corresponding to formula I.

14. A composition according to claim 1, wherein the mass ratio of the electrolytic non-block (co)polymer to the carbon nanotubes is 1:10 to 10:1.

15. A composition according to claim 1, wherein the mass ratio of the electrolytic non-block (co)polymer to the carbon nanotubes is 1:10 to 1:1.

16. A composition according to claim 1, wherein X is hydrogen, Y is aryl, Z is

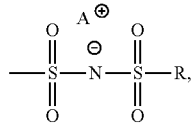

A is K, and R is $CF_3$.

17. A conductive transparent electrode obtained using a composition according to claim 1.

18. An organic light-emitting diode or a photovoltaic organic cell comprising a conductive transparent electrode in accordance with claim 17.

19. A conductive transparent electrode comprising the composition according to claim 1.

20. A method of preparing the composition according to claim 1, comprising combining the carbon nanotubes and the electrolytic non-block (co)polymer.

* * * * *